United States Patent
Kumar et al.

(10) Patent No.: US 11,005,503 B2
(45) Date of Patent: May 11, 2021

(54) MEMORY SYSTEM WITH HYBRID DECODING SCHEME AND METHOD OF OPERATING SUCH MEMORY SYSTEM

(71) Applicant: SK hynix Inc., Gyeonggi-do (KR)

(72) Inventors: Naveen Kumar, San Jose, CA (US); Aman Bhatia, San Jose, CA (US); Abhiram Prabhakar, San Jose, CA (US); Chenrong Xiong, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/297,277

(22) Filed: Mar. 8, 2019

(65) Prior Publication Data

US 2019/0288713 A1    Sep. 19, 2019

Related U.S. Application Data

(60) Provisional application No. 62/643,982, filed on Mar. 16, 2018.

(51) Int. Cl.
| | |
|---|---|
| *H03M 13/37* | (2006.01) |
| *G11C 29/52* | (2006.01) |
| *H03M 13/11* | (2006.01) |
| *G06F 11/10* | (2006.01) |

(52) U.S. Cl.
CPC ..... *H03M 13/3753* (2013.01); *G06F 11/1068* (2013.01); *G11C 29/52* (2013.01); *H03M 13/1102* (2013.01)

(58) Field of Classification Search
CPC ......... H03M 13/3753; H03M 13/1102; H03M 13/3715; H03M 13/1108; H03M 13/1117; G11C 29/52; G11C 2029/0409; G11C 16/08; G11C 29/38; G06F 11/1068; G06F 11/1048

See application file for complete search history.

(56) References Cited

U.S. PATENT DOCUMENTS

| | | |
|---|---|---|
| 7,035,285 B2 | 4/2006 | Holloway et al. |
| 7,502,982 B2 | 3/2009 | Siivus et al. |
| 8,069,397 B2 | 11/2011 | Vityaev et al. |

(Continued)

OTHER PUBLICATIONS

Jinghu Chen and Marc Fossorier, Near optimum universal belief propagation based decoding of low-density parity check codes, IEEE Transactions on Communications, vol. 50, No. 3, Mar. 2002.

*Primary Examiner* — Thien Nguyen
(74) *Attorney, Agent, or Firm* — IP & T Group LLP

(57) ABSTRACT

Memory controllers, decoders and methods execute a hybrid decoding scheme. An initial iteration of decoding of a codeword is performed using a bit-flipping (BF) decoder or a min-sum (MS) decoder depending on whether or not an unsatisfied check (USC) count of the codeword is less than a threshold. For this initial iteration, the BF decoder is used when the USC count is less than the threshold, and MS decoder when the USC count is greater than or equal to the threshold. When decoding of the codeword is initially performed with the BF decoder, decoding continues with the BF decoder until a first set of conditions is satisfied or the codeword is successfully decoded. When decoding of the codeword is performed with the MS decoder, decoding continues with the MS decoder until a second set of conditions is satisfied.

20 Claims, 6 Drawing Sheets

(56) References Cited

U.S. PATENT DOCUMENTS

| | | |
|---|---|---|
| 8,621,318 B1 | 12/2013 | Micheloni et al. |
| 9,092,353 B1 | 7/2015 | Micheloni et al. |
| 9,565,581 B2 | 2/2017 | Zhang et al. |
| 9,614,548 B1 | 4/2017 | Nguyen et al. |
| 9,842,020 B2 | 12/2017 | Sengoku |
| 10,164,656 B2 | 12/2018 | Yang et al. |
| 2004/0134988 A1 | 7/2004 | Pettinelli, Jr. et al. |
| 2005/0041746 A1 | 2/2005 | Rosen et al. |
| 2009/0282319 A1 | 11/2009 | No et al. |
| 2013/0046958 A1* | 2/2013 | Zhang .................. G06F 9/30 712/208 |
| 2014/0223256 A1 | 8/2014 | Sakai et al. |
| 2014/0313610 A1* | 10/2014 | Zhang .............. G11B 20/10268 360/53 |
| 2015/0263761 A1* | 9/2015 | Varnica .............. H03M 13/1108 714/755 |
| 2016/0274971 A1 | 9/2016 | Kang et al. |
| 2017/0125114 A1 | 5/2017 | Alhussien et al. |
| 2017/0168894 A1 | 6/2017 | Kim et al. |
| 2017/0310342 A1 | 10/2017 | Yen et al. |
| 2018/0013450 A1 | 1/2018 | Hsiao et al. |
| 2018/0293131 A1 | 10/2018 | Lin et al. |
| 2019/0149168 A1 | 5/2019 | Chang et al. |

\* cited by examiner

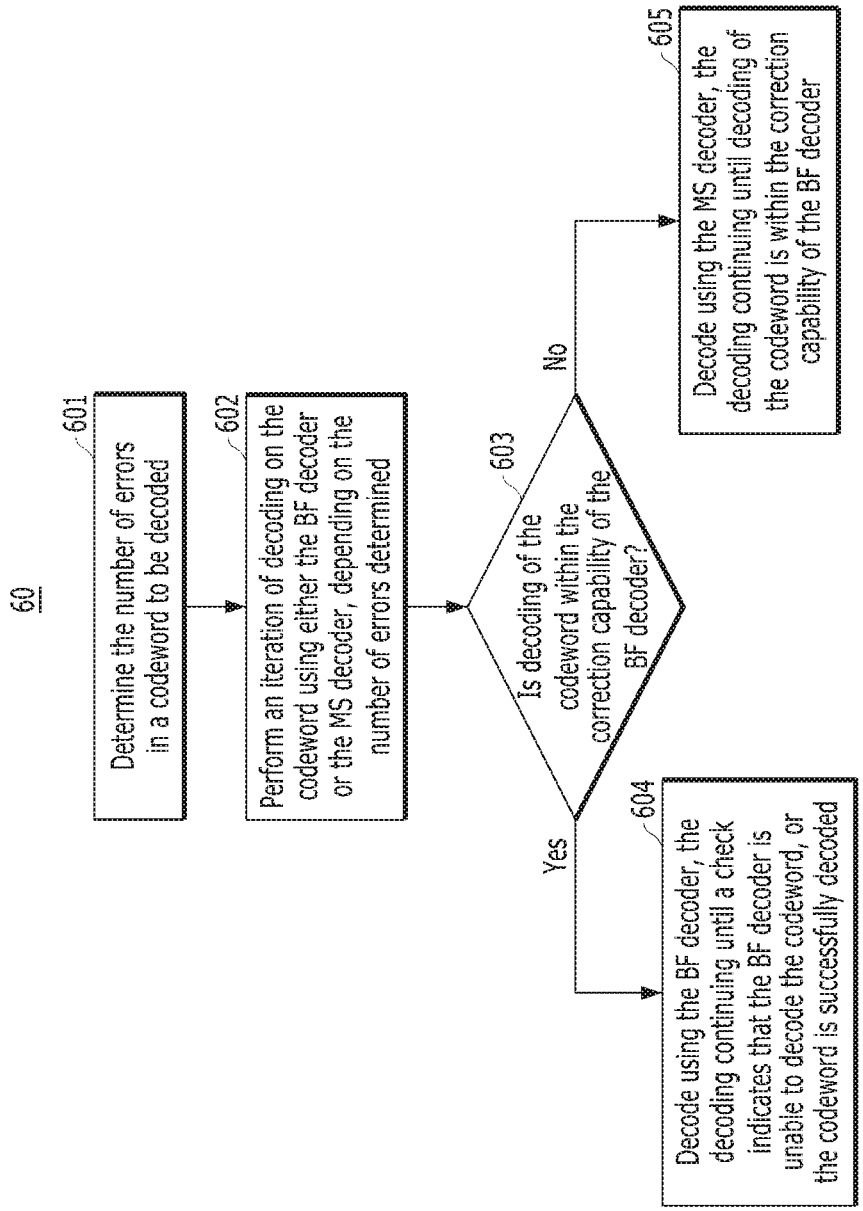

MEMORY SYSTEM WITH HYBRID DECODING SCHEME AND METHOD OF OPERATING SUCH MEMORY SYSTEM

CROSS-REFERENCE TO RELATED APPLICATION

This application claims the benefit of U.S. Provisional Application No. 62/643,982, filed Mar. 16, 2018, the entire content of which is incorporated herein by reference.

BACKGROUND

1. Field

Embodiments of the present disclosure relate to a memory system and components thereof capable of executing a hybrid decoding scheme, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data.

A bit-flipping (BF) decoder can be used for decoding LDPC codewords. The BF decoder provides higher throughput and consumes relatively low power on system-on-chip (SoC) architecture. However, the correction capability of a BF decoder is limited, and its performance has an error floor. Relative to the BF decoder, a min-sum (MS) decoder has much higher correction capability and may be used for codewords that a BF decoder failed to decode. However, the MS decoder has lower throughput and requires higher power on an SoC architecture.

Also, a BF decoder is useful at the beginning of the life of a NAND flash storage when errors from the NAND are much lower compared to the middle to end of the life and the end of the life of the NAND.

In this context embodiments of the present invention arise.

SUMMARY

Aspects of the present invention include memory controllers and decoders. In one aspect, a memory controller comprises a first decoder configured to perform decoding of a codeword when an unsatisfied check (USC) count of the codeword is less than a threshold; and a second decoder configured to perform decoding of a codeword when the USC count of the codeword is greater than or equal to the threshold. When decoding of the codeword is performed with the first decoder, decoding continues with the first decoder until a first set of conditions is satisfied or the codeword is successfully decoded, and when decoding of the codeword is performed with the second decoder, decoding continues with the second decoder until a second set of conditions is satisfied.

The first decoder is preferably a bit-flipping (BF) decoder and the second decoder is preferably a min-sum (MS) decoder.

In another aspect a memory controller comprises a decoder assembly including a BF decoder and an MS decoder. The decoder assembly is configured to calculate an unsatisfied check (USC) count of the codeword, and determine whether the USC count is less than a first threshold. The decoder assembly is further configured to perform one or more iterations of decoding on the codeword using the BF decoder, when it is determined that the USC count is less than the first threshold, the one or more iterations of decoding on the codeword using the BF decoder continuing until the USC count is reduced to a set number or a running average of the USC count (RA) becomes less than a second threshold, and perform one or more iterations of decoding on the codeword using the MS decoder, when it is determined that the USC count is greater than or equal to the first threshold, or when the RA becomes greater than or equal to the second threshold, the one or more iterations of decoding on the codeword using the MS decoder continuing until the USC count becomes less than the first threshold and the RA becomes less than a third threshold.

Further aspects of the present invention include methods of decoding, which may be performed by memory controllers and components thereof, such as decoders, particularly BF and MS decoders. In this regard, another aspect of the present invention, entails a method of decoding a codeword, which comprises determining a number of errors in the codeword; performing an iteration of decoding on the codeword using one of a first decoder and a second decoder depending on a result of the determining operation, the first and second decoders being of different types; and performing one or more additional iterations of decoding on the codeword. Such iteration(s) is/are performed using the first decoder when, after the initial iteration of decoding is performed, it is determined that the codeword is within the correction capability of the first decoder, the one or more additional iterations of decoding using the first decoder continuing until the first decoder is unable to decode the codeword or the codeword is successfully decoded. Such iteration(s) is/are using the second decoder when, after the initial iteration of decoding is performed, it is determined that the codeword exceeds the correction capability of the first decoder, the one or more additional iterations of decoding using the second decoder continuing until the codeword is within the correction capability of the first decoder.

The first decoder is preferably a BF decoder and the second decoder is preferably an MS decoder.

Additional aspects of the present invention will become apparent from the following description.

BRIEF DESCRIPTION OF THE DRAWINGS

FIG. 6 is a flow chart illustrating steps in processes for hybrid decoding in accordance with embodiments of the present invention.

DETAILED DESCRIPTION

Figure 1:
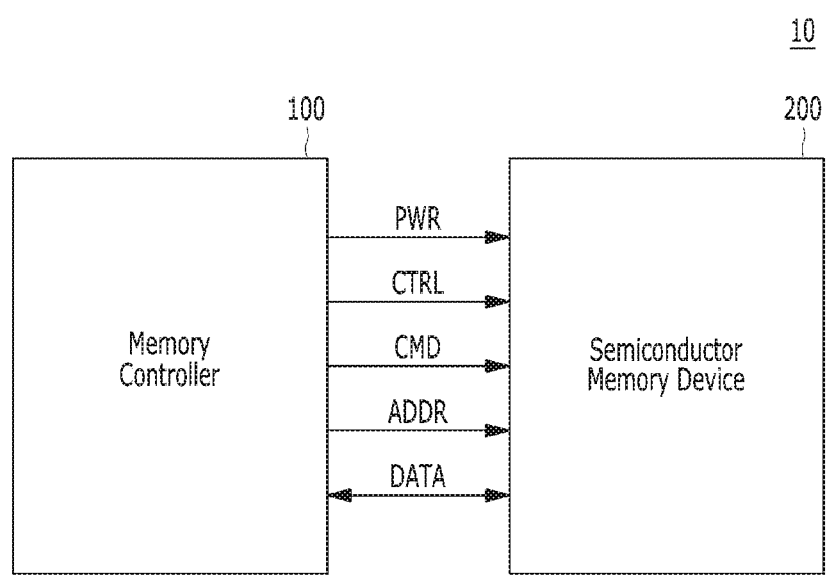
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
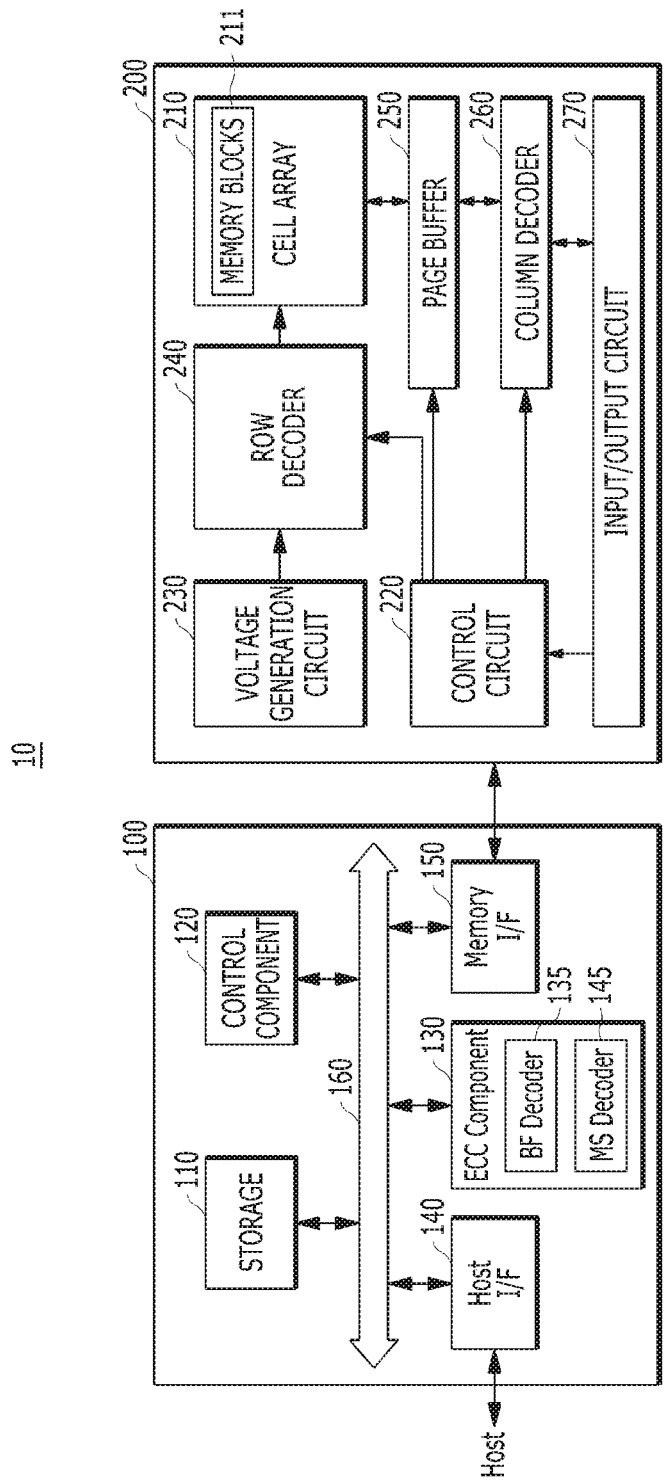
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM), or Generalized LDPC (GLDPC) code, the latter of which has particular relevance to the present invention. The ECC component 130 may include any and all circuits, systems or devices for suitable error correction operation in accordance with embodiments of the present invention.

The present invention is particularly applicable to decoding LDPC codes using a bit-flipping (BF) decoder and a min-sum (MS) decoder. To that end, in embodiments of the present invention, the ECC component 130 includes a BF decoder 135 and an MS decoder 145. As explained in more detail below, the ECC component 130 including the BF and MS decoders 135, 145 are configured to execute a hybrid decoding scheme on LDPC codes.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer (array) 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
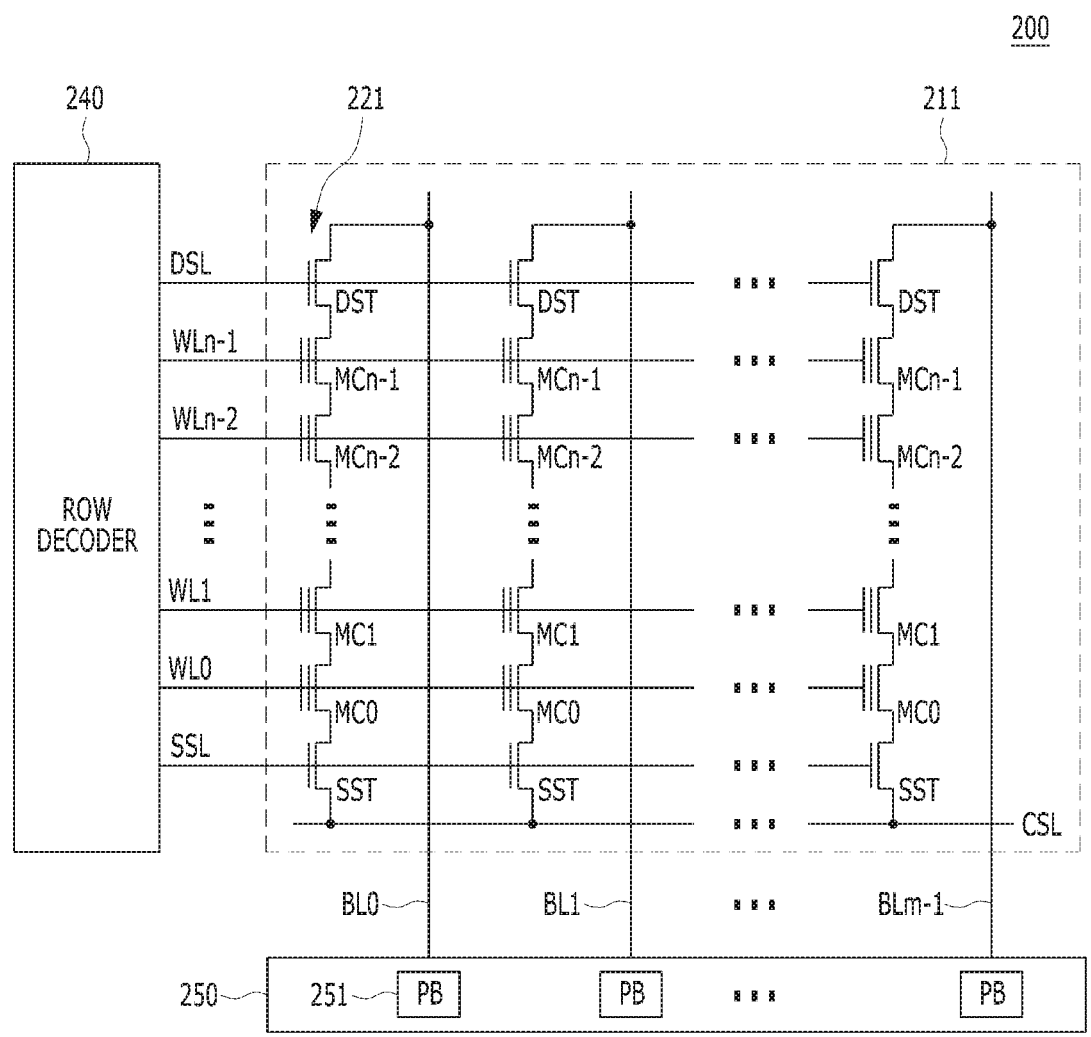
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
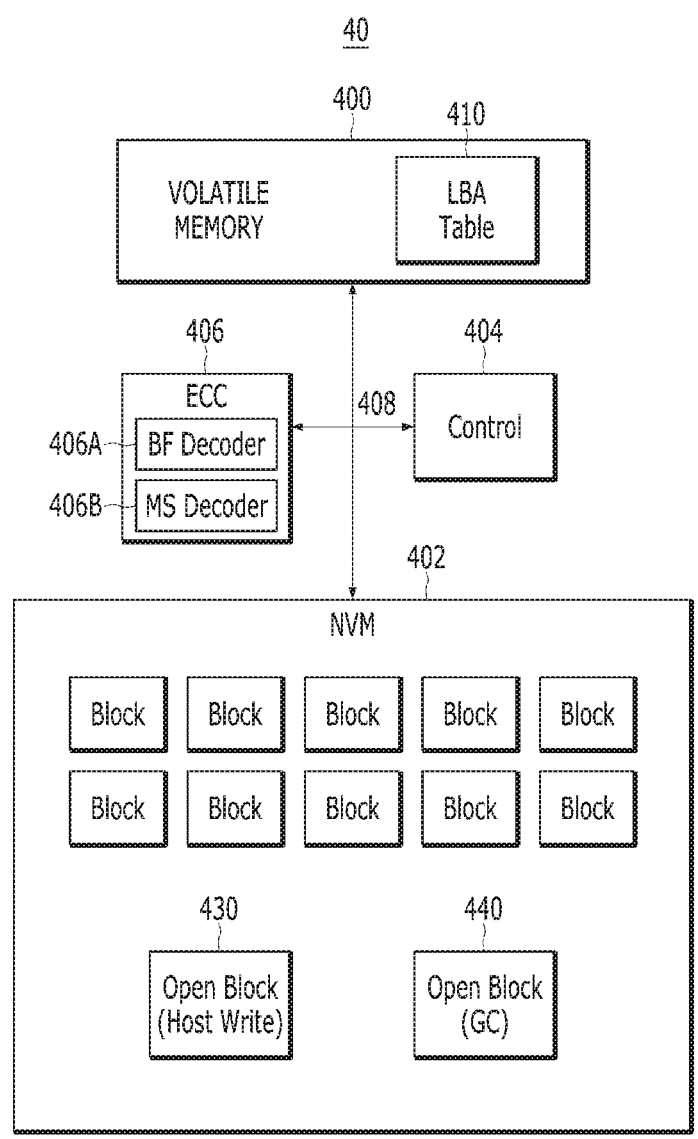
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include a BF decoder 406A and an MS decoder 406B, which may correspond to the BF decoder 135 and MS decoder 145 respectively in FIG. 2. The ECC module 406 including its BF and MS decoders 406A, 406B may be used to carry out aspects of the present invention. Additional/alternative components that may be utilized with memory systems to effectuate the present invention will be understood to those of skill in the art in light of this disclosure.

BF and MS decoders offer trade-offs in terms of error correction capability, throughput and power consumption. Such decoders also tend to be more useful in different periods of the life of a memory system, particularly in a system that employs a NAND flash memory.

As the inventors have discovered, there is a significant period of the life of a memory system that would benefit from an efficient scheduling scheme that judiciously exploits advantages of BF and MS decoders to provide better throughput and lower power consumption on a SoC architecture. Accordingly, embodiments of the present invention provide a hybrid decoding scheme in which codewords are effectively scheduled or routed to one or both of the BF decoder 135 and the MS decoder 145 for hard decoding for providing such advantages.

Embodiments of the present invention makes intelligent use of the BF decoder 135 and an MS decoder 145 in hard decoding, which may advantageously increase throughput and lower power consumption of a SoC architecture. Codewords are efficiently routed depending on certain detected or determined characteristics.

According to embodiments, the BF decoder 135 is mainly used for decoding at the start of the life of the memory device 200, e.g., NAND flash memory. As the number of errors in codewords from the memory device 200 increase and eventually exceed the correction capability of the BF decoder 135, the MS decoder 145 is used sporadically depending upon the unsatisfied check (USC) information. After MS decoding, BF decoding is scheduled when the number of errors remaining in the codeword is within the correction capability of BF decoder 135.

Figure 5:
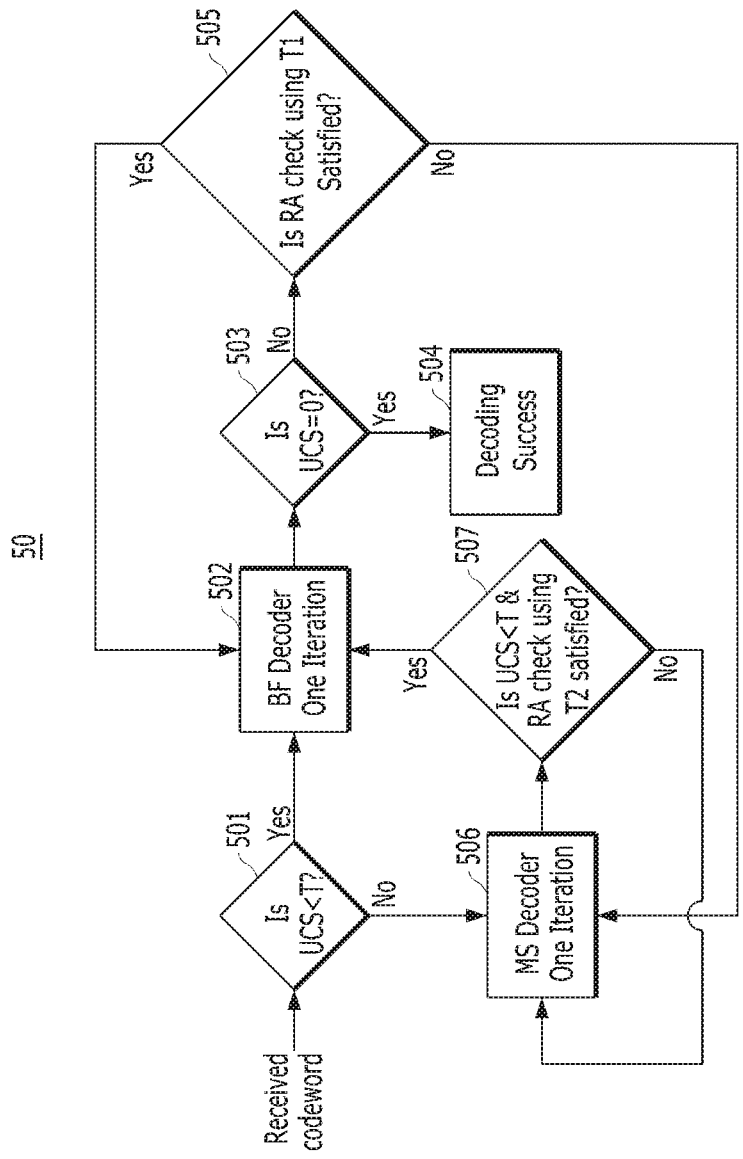
FIG. 5 is a flow chart showing hybrid LDPC decoding in accordance with an embodiment of the present invention.

The hybrid decoding scheme in accordance with embodiments is illustrated is shown in the flow chart 50 of FIG. 5. The decoding may be performed by the BF decoder 135/406A and MS decoder 145/406B within the ECC component 130 or ECC module 406 respectively, and may operate in conjunction with other components of the memory controller 100. The BF decoder 135/406A and MS decoder 145/406B may be implemented with appropriate hardware, software, firmware or combination thereof.

Referring to FIG. 5, a codeword is received from the NAND channel and the number of unsatisfied checks, i.e., its USC count, is calculated. At step 501, it is determined whether the USC count is less than threshold T, the value of which is set to distinguish between an error level that is within the correction capability of the BF decoder 135 and an error level that exceeds the correction capability of the BF decoder 135. If the USC count is less than the threshold T (Yes at step 501), the BF decoder 135 is used for decoding because the number of errors in the codeword is relatively small, i.e., within the correction capability of the BF decoder 135. In that case, one iteration of BF decoding is performed at step 502.

USC information is tracked and maintained to determine whether decoding of the codeword is converging so that log-likelihood ratio (LLR) information is not corrupted by the BF decoder 135. At step 503, it is determined whether the USC count has been reduced to a sufficiently low number, e.g., 0. If so (Yes at step 503), the codeword has been successfully decoded, i.e., there is decoding success, as indicated at step 504.

If the USC count has not been reduced such that it has reached the set low number, e.g., 0 (No at step 503), then the flow proceeds to step 505, where a running average of USC (RA) is calculated and compared with a threshold $T_1$. More specifically, RA is calculated as: $RA_k = \Sigma_{i=k-L}^{k} USC_i/L$, where the value of L may be optimized heuristically. If $RA_{k-1} - RA_k < T_1$ (Yes at step 505), the process returns to step 502, where BF decoding is continued. Here, the value of $T_1$ may be optimized heuristically. If $RA_{k-1} - RA_k > T_1$, that means that the decoding with the BF decoder 135 is diverging and that the MS decoder 145 should be used to correct errors. Thus, when $RA_{k-1} - RA_k > T_1$, i.e., the RA check is not satisfied (No at step 505), the process moves to step 506, where one iteration of MS decoding is performed using the MS decoder 145. The decoding algorithm may be designed to handle the case of $RA_{k-1} - RA_k = T_1$ either way.

At step 507, another check involving RA and the USC count, $RA_{k-1} - RA_k < T_2$ & USC<T, is done after one iteration of MS decoding to determine whether the number of errors have been significantly reduced and whether they are within the correction capability of the BF decoder 135 to decide whether to continue decoding with the MS decoder 145 or to send the codeword to the BF decoder 135. As with $T_1$, the value of $T_2$ also may be optimized heuristically. Thus, if $RA_{k-1} - RA_k < T_2$ & USC<T (Yes at step 507), the process returns to step 502, where an iteration of BF decoding is performed. On the other hand, if the decision at step 507 is 'No', another iteration of MS decoding is performed at step 506.

This inventive scheme exploits USC information to efficiently route or schedule decoding on BF and MS decoders, which in turn provides substantial power and throughput gains. In an embodiment, the BF and MS decoders are implemented as a dual decoder with the functionality of BF and MS decoding for easier hardware implementation. However, the present invention is not limited to that arrangement; the hybrid decoding scheme may be carried out with any suitable implementation of the decoders.

FIG. 6 is a flow chart describing steps in processes for hybrid decoding, in accordance with embodiments of the present invention. The steps shown in flow chart 60 are exemplary. Those skilled in the art will understand that additional and/or alternative steps may be performed, or that the order of steps may be changed, to effectuate aspects of the present invention without departing from the inventive concepts disclosed herein.

At step 601, the number of errors in a codeword to be decoded is determined. In an embodiment, the USC count is calculated. At step 602, an iteration of decoding is performed. That iteration is performed using the BF decoder 135 when the number of errors is relatively low, i.e., within the correction capability of the BF decoder 135, which may be reflected by an appropriately low USC count. On the other hand, that first iteration is performed using the MS decoder 145 when the number of errors is relatively high, i.e., exceeding the correction capability of the BF decoder 135, which may be reflected by a high USC count.

After the initial decoding iteration, another check is performed at step 603 to determine whether or not the codeword is within the correction capability of the BF decoder 135. The particular check performed at step 603 may be different depending on whether the first decoding iteration was done using the BF decoder 135 or the MS decoder 145, as described in connection with FIG. 5. However, either check may be in form of determining whether certain conditions are satisfied. In the case of the first iteration having been performed by the BF decoder 135, the check may comprise the determinations of steps 503 and 505 of FIG. 5. In the case of the first iteration having been performed by the MS decoder 145, the check may be comprise the determinations of step 507 of FIG. 5.

If the check at step 603 indicates that the codeword is within the error correction capability of the BF decoder 135 (Yes at step 603), then one or more iterations of decoding are performed using the BF decoder 135. If the check indicates that the codeword exceeds the error correction capability of the BF decoder 135 (No at step 603), then one or more iterations of decoding are performed using the MS decoder 145.

The iterations continue on the particular decoder, BF or MS, until the decoding results, which may be checked after iteration, indicate that decoding should be switched from the BF decoder 135 to the MS decoder 145 or vice versa.

Thus, in the case where the BF decoder 135 is to be used for at least one additional iteration (Yes at step 603), decoding using the BF decoder 135 continues until a check indicates the BF decoding is not able to decode the codeword, or the codeword is successfully decoded (step 604). In this loop, where the initial iteration of decoding (and perhaps even one or more iterations) was performed by the BF decoder 135, the check may involve calculations that determine whether or not the codeword is converging. If decoding of the codeword is not converging using the BF decoder 135, continued decoding is routed to the MS decoder 145.

If the decision at step 603 indicates that decoding of the codeword exceeds the capability of the BF decoder 135 (No at step 603), then additional decoding is performed by the MS decoder 145 at step 605. Such decoding with the MS decoder 145 continues until decoding of the codeword is within the error correction capability of the BF decoder 135, at which point the codeword is routed (back) to the BF decoder 135.

Thus, the present invention provides an effective hybrid decoding scheme which utilizes two decoders, a BF decoder and an MS decoder, to execute decoding to improve throughput and consume less power.

As the foregoing demonstrates, embodiments of the present invention provide a hybrid decoding scheme for decoding LDPC codewords. The hybrid decoding scheme advantageously initially schedules and switches between BF decoding and MS decoding to provide higher throughput and lower power consumption on SoC.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
a first decoder configured perform a first decoding operation, which is an initial decoding operation, to obtain an unsatisfied check (USC) count of a codeword and to perform a second decoding operation, which is a main iterative decoding operation, of decoding the codeword when the USC count of the codeword is less than a threshold; and
a second decoder configured to perform decoding of a codeword when the USC count of the codeword is greater than or equal to the threshold,
wherein, when decoding of the codeword is performed with the first decoder, decoding continues with the first decoder until a first set of conditions is satisfied or the codeword is successfully decoded, and
wherein, when decoding of the codeword is performed with the second decoder, decoding continues with the second decoder until a second set of conditions is satisfied,
wherein each of the first and second conditions include use of a running average of the USC count.

2. The memory controller of claim 1, wherein the first decoder is a bit-flipping (BF) decoder and the second decoder is a min-sum (MS) decoder.

3. The memory controller of claim 1, wherein, when decoding of the codeword is performed with the first decoder, subsequent decoding of the codeword is performed with the second decoder when the first set of conditions becomes satisfied and continues until the second set of conditions becomes satisfied.

4. The memory controller of claim 1, wherein, when decoding of the codeword is performed with the second decoder, subsequent decoding of the codeword is performed with the first decoder when the second set of conditions becomes satisfied and continues until the first set of conditions becomes satisfied.

5. The memory controller of claim 1, wherein
when decoding of the codeword is performed with the first decoder, whether the first set of conditions is satisfied is determined after each iteration of decoding, and
when decoding of the codeword is performed with the second decoder, whether the second set of conditions is satisfied is determined after each iteration of decoding.

6. The memory controller of claim 1, wherein the codeword comprises low-density parity-check (LDPC) codes.

7. A memory controller comprising:
a decoder assembly including a bit-flipping (BF) decoder and a min-sum (MS) decoder, the decoder assembly configured to:
perform a first decoding operation, which is an initial decoding operation, using one of the BF decoder and the MS decoder, to calculate an unsatisfied check (USC) count of a codeword, wherein the decoder used to perform the initial decoding operation is further configured to perform a second decoding operation, which is a main iterative decoding operation,
determine whether the USC count is less than a first threshold,
perform one or more iterations of decoding on the codeword using the BF decoder, when it is determined that the USC count is less than the first threshold, the one or more iterations of decoding on the codeword using the BF decoder continuing until the USC count is reduced to a set number or a running average of the USC count (RA) becomes less than a second threshold, and
perform one or more iterations of decoding on the codeword using the MS decoder, when it is determined that the USC count is greater than or equal to the first threshold, or when the RA becomes greater than or equal to the second threshold, the one or more iterations of decoding on the codeword using the MS decoder continuing until the USC count becomes less than the first threshold and the RA becomes less than a third threshold.

8. The memory controller of claim 7, wherein the decoder assembly is further configured to:
determine, at each iteration of decoding on the codeword using the BF decoder, whether the USC count is reduced to the set number, and if so, determine whether the RA is less than the second threshold.

9. The memory controller of claim 8, wherein the set number is 0.

10. The memory controller of claim 7, wherein the decoding assembly is further configured to:
determines, at each iteration of decoding on the codeword using the MS decoder, whether the USC count is less than the first threshold and the RA is less than the third threshold.

11. The memory controller of claim 9, wherein, when it is determined that the USC count is 0, decoding of the codeword is deemed successful.

12. A method of decoding a codeword, the method comprising:
performing a first decoding operation, which is an initial decoding operation, of determining a number of errors in the codeword based on an unsatisfied check (USC) count of the codeword using one of a first decoder and a second decoder, wherein the decoder used to perform the initial decoding operation is further configured to perform a second decoding operation, which is a main iterative decoding operation;
performing an iteration of decoding on the codeword using one of a first decoder and a second decoder depending on a result of the determining operation, the first and second decoders being of different types; and
performing one or more additional iterations of decoding on the codeword
using the first decoder when, after the initial iteration of decoding is performed, it is determined that the codeword is within the correction capability of the first decoder, the one or more additional iterations of decoding using the first decoder continuing until the first decoder is unable to decode the codeword or the codeword is successfully decoded, or using the second decoder when, after the initial iteration of decoding is performed, it is determined that the codeword exceeds the correction capability of the first decoder, the one or more additional iterations of decoding using the second decoder continuing until the codeword is within the correction capability of the first decoder, wherein, after performing one or more additional iterations of decoding using the second decoder whether the codeword exceeds the correction capability of the first decoder, is determined based on running average (RA) of the USC count of the codeword.

13. The method of claim 12, wherein the first decoder is a bit-flipping (BF) decoder and the second decoder is a min-sum (MS) decoder.

14. The method of claim 12, wherein the determining of a number of errors in the codeword comprises determining whether the USC count is less than a threshold.

15. The method of claim 12, wherein the performing of one or more additional iterations of decoding on the codeword comprises:

using the first decoder when, after the initial iteration of decoding is performed by the first decoder, a first set of conditions is not satisfied, or when, after the initial iteration of decoding is performed by the second decoder, a second set of conditions is satisfied, the one or more additional iterations of decoding using the first decoder continuing until the first set of conditions is satisfied or the codeword is successfully decoded, or using the second decoder when, after the initial iteration of decoding is performed by the second decoder, the second set of conditions is not satisfied, or when, after the initial iteration of decoding is performed by the first decoder, the second set of conditions is satisfied, the one or more additional iterations of decoding using the second decoder continuing until the second set of conditions is satisfied.

16. The method of claim 15, further comprising:

determining, after each of the one or more additional iterations of decoding on the codeword using the first decoder, whether the first set of conditions is satisfied; and determining, after each of the one or more additional iterations of decoding on the codeword using the second decoder, whether the second set of conditions is satisfied.

17. The method of claim 16, wherein the first set of conditions comprise the USC count of the codeword compared to a set number and the RA compared to a threshold, the first set of conditions not being satisfied when the USC count is greater than the set number and the RA is less than the threshold.

18. The method of claim 16, wherein the second set of conditions comprise the USC count of the codeword compared to a first threshold and the RA compared to a second threshold, the second set of conditions not being satisfied when the USC count is greater than or equal to the first threshold and the RA greater than or equal to the RA.

19. The method of claim 12, wherein the codeword comprises low-density parity-check (LDPC) codes.

20. The method of claim 17, wherein when the USC count is reduced to the set number, decoding of the codeword is deemed successful.

* * * * *